United States Patent
Lin

(10) Patent No.: US 8,280,339 B2
(45) Date of Patent: *Oct. 2, 2012

(54) MIXER CAPABLE OF DETECTING OR CONTROLLING COMMON MODE VOLTAGE THEREOF

(75) Inventor: Ying-Hsi Lin, Hsin-Chu (TW)

(73) Assignee: Realtek Semiconductor Corp., Hsinchu (TW)

( * ) Notice: Subject to any disclaimer, the term of this patent is extended or adjusted under 35 U.S.C. 154(b) by 1385 days.

This patent is subject to a terminal disclaimer.

(21) Appl. No.: 11/621,121

(22) Filed: Jan. 9, 2007

(65) Prior Publication Data

US 2007/0111694 A1  May 17, 2007

Related U.S. Application Data

(62) Division of application No. 11/161,247, filed on Jul. 27, 2005, now Pat. No. 7,375,577.

(30) Foreign Application Priority Data

Aug. 18, 2004  (TW) .............................. 93124833 A

(51) Int. Cl.
  *H04B 1/26*  (2006.01)
(52) U.S. Cl. ...................... 455/326; 455/127.1; 455/233; 455/234.2
(58) Field of Classification Search .................. 455/326, 455/127.1, 233, 234.2, 130, 226.1–226.4, 455/341

See application file for complete search history.

(56) References Cited

U.S. PATENT DOCUMENTS

| | | | |
|---|---|---|---|
| 4,080,573 A | 3/1978 | Howell | |
| 4,193,036 A | 3/1980 | Cerny, Jr. et al. | |
| 5,548,840 A | 8/1996 | Heck | |
| 5,745,523 A * | 4/1998 | Dent et al. | 375/216 |
| 6,029,060 A * | 2/2000 | Ashby | 455/326 |
| 6,073,002 A | 6/2000 | Peterson | |
| 6,205,325 B1 | 3/2001 | Groe | |
| 6,342,804 B1 * | 1/2002 | Havens et al. | 327/357 |
| 6,510,314 B1 | 1/2003 | Kuo | |
| 6,871,057 B2 | 3/2005 | Ugajin et al. | |
| 6,982,588 B1 | 1/2006 | Lin et al. | |
| 7,031,683 B2 * | 4/2006 | Vishakhadatta et al. | 455/197.2 |
| 7,035,607 B2 * | 4/2006 | Lim et al. | 455/147 |
| 7,088,981 B2 | 8/2006 | Chang | |
| 7,099,646 B1 | 8/2006 | Jin et al. | |
| 7,120,414 B2 | 10/2006 | Kim et al. | |
| 7,161,406 B1 | 1/2007 | Ferris | |
| 7,200,364 B2 * | 4/2007 | Lim et al. | 455/76 |

OTHER PUBLICATIONS

Domine Leenaerts et al., "1/f Noise in Passive CMOS Mixers for Low and Zero IF Integrated Receivers", ESSCIRC Sep. 2001.
Thomas H. Lee, "The Design of CMOS Radio-Frequency Integrated Circuit" ( ISBN 0-521-63922-0).

* cited by examiner

*Primary Examiner* — Duc Nguyen
*Assistant Examiner* — Ajibola Akinyemi
(74) *Attorney, Agent, or Firm* — Thomas, Kayden, Horstemeyer & Risley, LLP

(57) ABSTRACT

A mixer capable of detecting or controlling a common mode voltage thereof, includes at least: a mixing module for mixing a first set of differential signals and a second set of differential signals to generate at least one mixed signal; and a compensation module for compensating at least one operation point of the mixing module.

12 Claims, 4 Drawing Sheets

MIXER CAPABLE OF DETECTING OR CONTROLLING COMMON MODE VOLTAGE THEREOF

CROSS REFERENCE TO RELATED APPLICATIONS

This application is a division of application Ser. No. 11/161,247, filed on Jul. 27, 2005, which issued on Feb. 23, 2006 as U.S. Pat. No. 7,375,577, and is incorporated herein by reference.

BACKGROUND OF THE INVENTION

1. Field of the Invention

The present invention relates to an up-converter or a down-converter in a communication system, and more particularly, to a mixer capable of detecting or controlling a common mode voltage thereof.

2. Description of the Prior Art

An up-converter or a down-converter in a communication system generally includes a mixer, and a passive mixer is typically utilized. A switching transistor of a passive mixer operates in a non-saturation region. The passive mixer is utilized in a direct down conversion receiver because it is cost-effective.

The utilization of operational amplifiers in mixers of the prior art results in more noises. Some complementary mixers may balance input signals, however, voltage gains of mixers are influenced by manufacture processes and temperature variations. One method to solve this problem is increasing the linearity of a mixer by increasing a linear region of transconductance of the mixer. Unfortunately, the influence to the voltage gain of the mixers by the manufacturing processes and temperature variations remains. Another method is increasing transconductance of the mixer with a feedback circuit to increase the linearity of the mixer. Unfortunately, the same problem of the influence to the voltage gain of the mixer caused by the manufacturing processes and temperature variations still exists.

SUMMARY OF THE INVENTION

It is an objective of the claimed invention to provide a mixer that reduces the influence to the voltage gain of mixers caused by the manufacturing process and temperature variations.

According to one embodiment of the claimed invention, a mixer comprises: a mixing module for mixing a first set of differential signals and a second set of differential signals to generate a mixed signal; a common mode voltage generator coupled to the mixing module for detecting a common mode voltage of the mixing module; and a compensation module coupled to the common mode voltage generator and the mixing module for compensating at least one operation point of the mixing module according to the common mode voltage.

According to one embodiment of the claimed invention, a mixer comprises: a mixing module for mixing a first set of differential signals and a second set of differential signals to generate a mixed signal, wherein the mixing module controls a common mode voltage of the mixed signal according to a first reference voltage; and a compensation module coupled to the mixing module for compensating at least one operation point of the mixing module according to the first reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
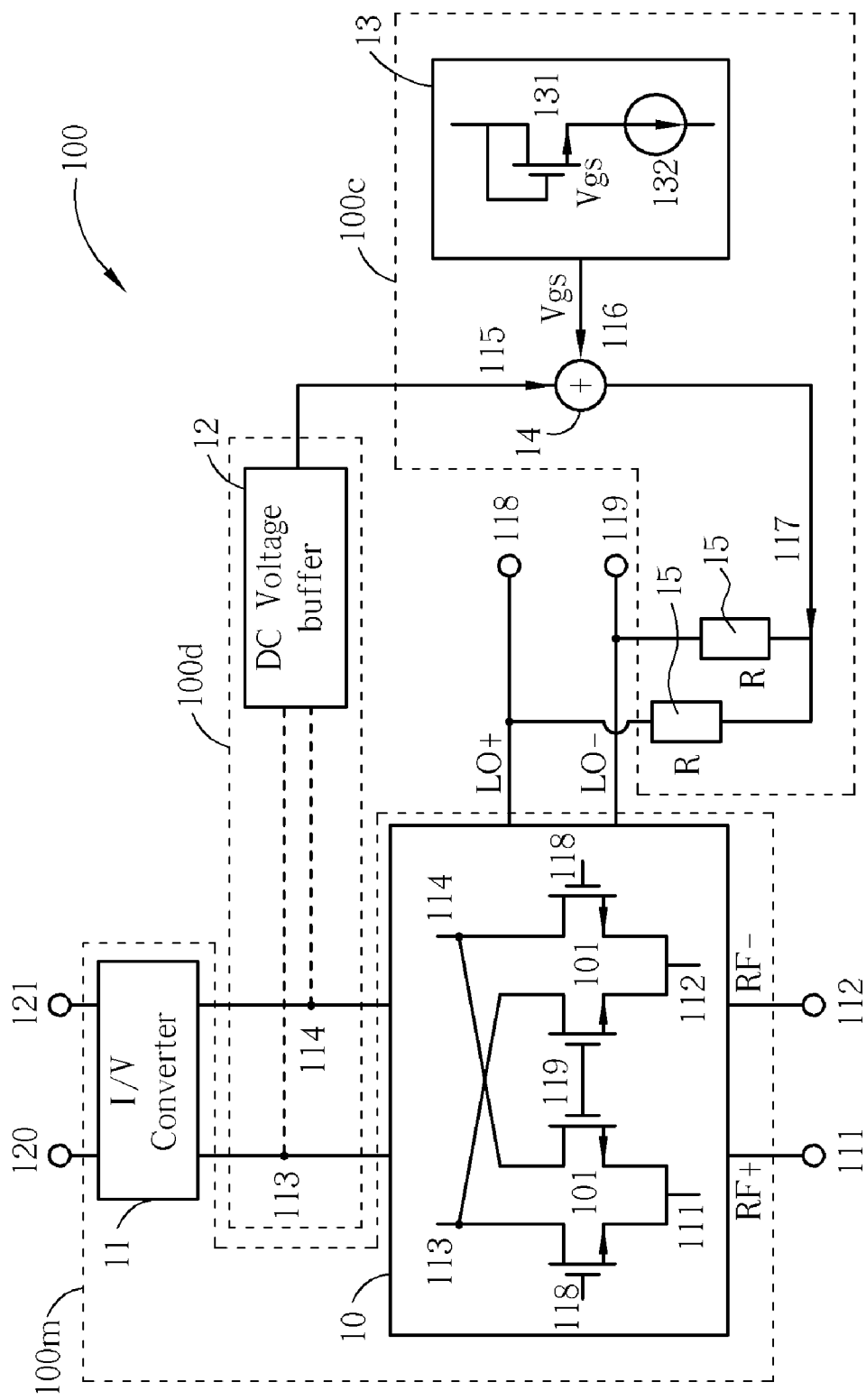
FIG. 1 is a diagram of a mixer according to the present invention.

Please refer to FIG. 1. FIG. 1 is a diagram of a mixer 100 according to the present invention. The mixer 100 comprises a mixing module 100m, a common mode voltage generator 100d, and a compensation module 100c. According to FIG. 1, signals at each set of input/output (I/O) terminals (111, 112), (113, 114), (118, 119), and (120, 121) are differential signals. A switching transistor circuit 10 within the mixing module 100m includes a plurality of switching transistors 101 utilized for mixing radio frequency (RF) signals with synthesizer signals, wherein the RF signals are inputted from the input terminals 111 and 112, and the synthesizer signals are inputted from the input terminals 118 and 119. Thus a set of differential current signals are generated at the I/O terminals 113 and 114. FIG. 1 illustrates that the switching transistor circuit 10 is a passive mixer. The operations of passive mixers are well known in the art and therefore the description in detail is omitted here. A current-to-voltage (I/V) converter 11 within the mixing module 100m converts the set of differential current signals into a set of differential voltage signals at the output terminals 120 and 121. Please note that the set of differential voltage signals are mixed signals of the RF signals and the synthesizer signals.

According to the present invention, the common mode voltage generator 100d is capable of generating a common mode voltage or detecting a direct current (DC) voltage of the I/O terminals 113 and 114, which is an average voltage level at the I/O terminals 113 and 114. In the compensation module 100c, a voltage synthesizing circuit 14 superposes a biasing voltage 116 and a common mode voltage 115 to generate a synthesized voltage 117, where the biasing voltage 116 is outputted by a biasing circuit 13 in the compensation module 100c, and the common mode voltage 115 is outputted by the common mode voltage generator 100d. Biasing the gates of the switching transistors 101 with two biasing units 15 of the compensation module 100c, the average voltage level at the input terminals 118 and 119 is equal to the synthesized voltage 117. The input terminals 118 and 119 are connected to the gates of the switching transistors 101, and the two biasing units 15 are high impedance biasing components, such as two resistors with resistance value R.

As shown in FIG. 1, the biasing circuit 13 includes a reference transistor 131 and a reference current source 132. A gate and a drain of the reference transistor 131 are coupled to each other. Additionally, the reference current source 132 drives the reference transistor 131 generating the biasing voltage 116. The switching transistors 101 and the reference transistor 131 are metal oxide semiconductor field effect transistors (MOSFETs). Gate-to-source voltages of the switching transistors 101 vary with a gate-to-source voltage Vgs of the reference transistor 131 since the switching transistors 101 and the reference transistor 131 have the same characteristics. The biasing voltage 116, which is the gate-to-source voltage Vgs of the reference transistor 131, is determined by the reference current source 132. By the compensation module 100c shown in FIG. 1, the mixer 100 of the present invention may compensate drift of operation points of the switching transistors 101 in the mixing module 100m. Therefore, the above-mentioned problem of the influence to the voltage gain due to processes or temperature variations is solved according to the present invention.

Although a threshold voltage Vth of any of the transistors varies with processes or temperature, transconductance (gm) of the switching transistors 101 varies with a current of the reference current source 132 since the gate-to-source voltages of the switching transistors 101 vary with the gate-to-source voltage Vgs of the reference transistor 131. A current source with constant gm can be utilized as the reference current source 132. Thus the gm of the switching transistors 101 will not vary with processes or temperature, meaning that the gm of the switching transistors will be constant, and the voltage gain of the passive mixer will not vary with processes or temperature according to the present invention.

Figure 2:
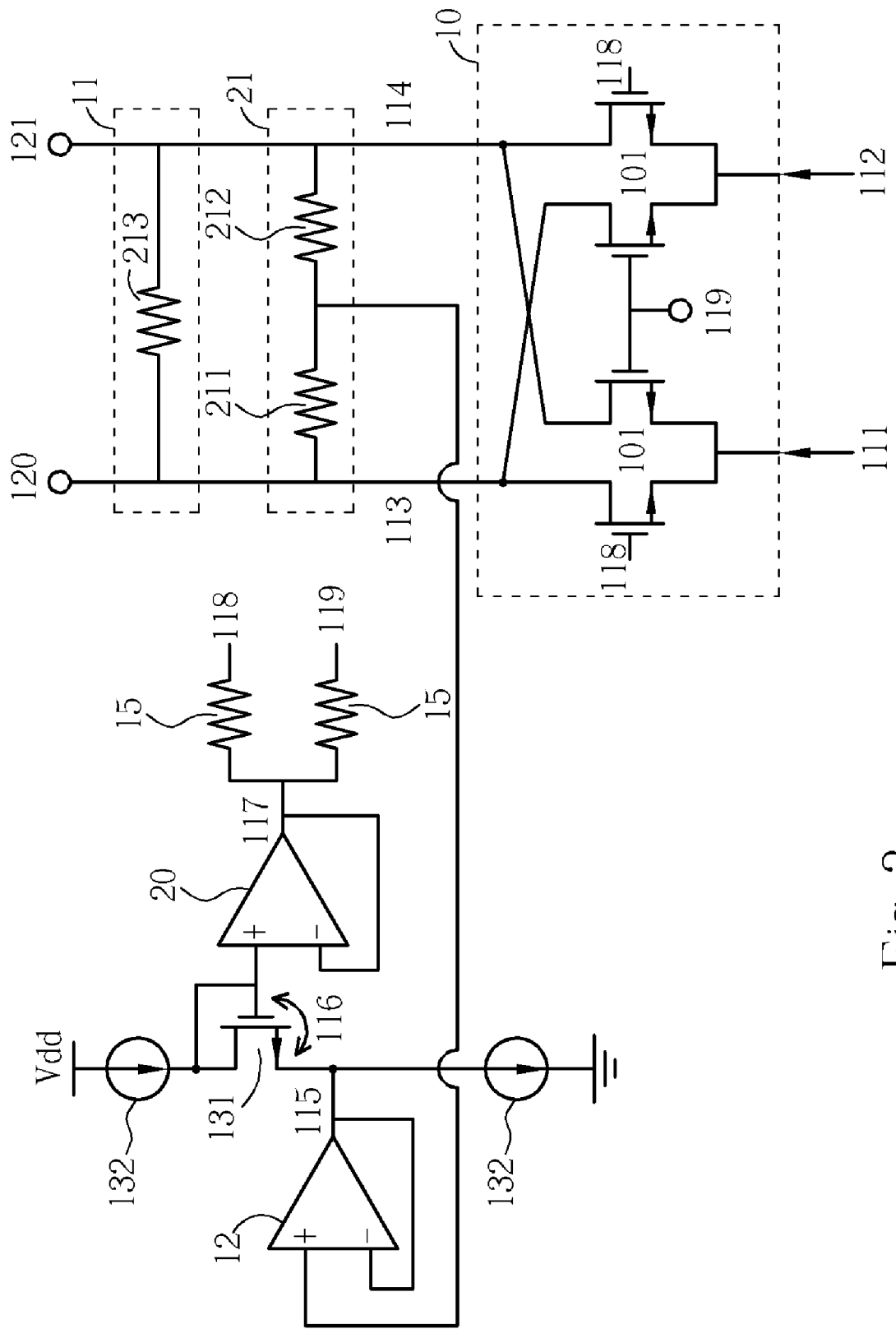
FIG. 2 is a diagram of a mixer according to a first embodiment of the present invention.

Please refer to FIG. 2. FIG. 2 is a diagram of a mixer according to a first embodiment of the present invention. According to this embodiment, the common mode voltage generator 100d derives the common mode voltage of the I/O terminals 113 and 114 by utilizing two resistors 211 and 212 with the same resistance value, and outputs the common mode voltage 115 by utilizing a DC voltage buffer 12. According to this embodiment, the compensation module 100c shown in FIG. 1 is implemented by coupling the reference transistor 131 to the DC voltage buffer 12, superposing the common mode voltage 115 and the gate-to-source voltage 116 of the reference transistor 131, utilizing another DC voltage buffer 20 to generate the synthesized voltage 117 of this embodiment, and outputting the synthesized voltage 117 to the input terminals 118 and 119 utilizing the two resistors 15 shown in FIG. 2. The I/V converter 11 of this embodiment is a resistor 213, which is well known in the art.

Figure 3:
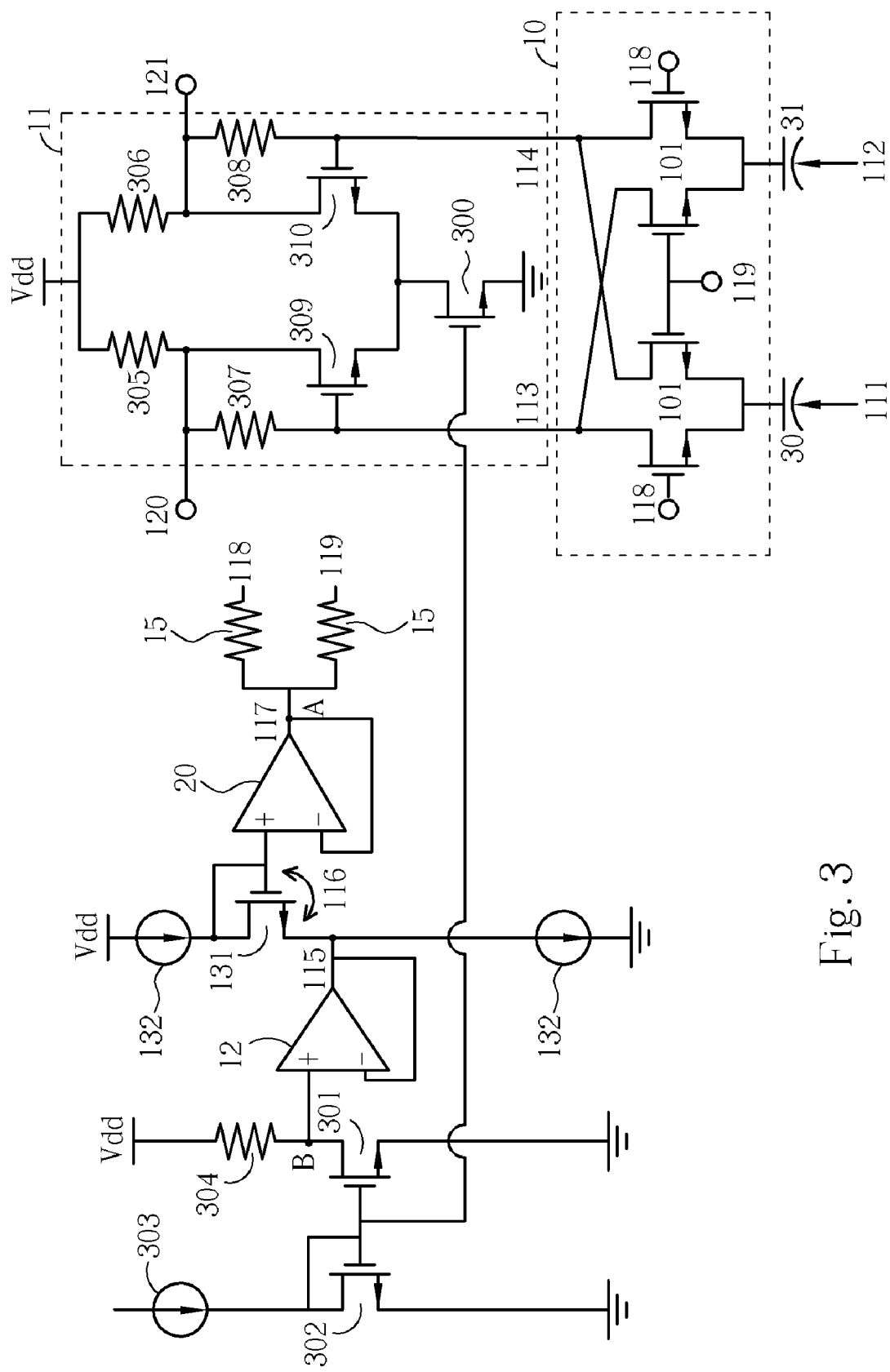
FIG. 3 is a diagram of a mixer according to a second embodiment of the present invention.

Please refer to FIG. 3. FIG. 3 is a diagram of a mixer according to a second embodiment of the present invention. According to this embodiment, the RF signals are inputted to the switching transistor circuit 10 through two AC coupling capacitors 30 and 31 respectively coupled to the input terminals 111 and 112. The I/V converter 11 of this embodiment includes two transconductor transistors 309 and 310, two loading resistors 305 and 306, and two feedback resistors 307 and 308. With the symmetry of the components 305-310 shown in FIG. 3, a total current flowing through a drain and a source of a transistor 300 is double of an average current flowing through a drain and a source of the transconductor transistor 309, and is also double of an average current flowing through a drain and a source of the transconductor transistor 310. One of the two relationships mentioned above is taken as an example for explanation. The common mode voltage generator 100d of this embodiment includes a common mode voltage following circuit, where the common mode voltage following circuit includes two transistors 301 and 302, a current source 303, and a resistor 304. Components 301-304 form a second current mirror. According to the above-mentioned relationship between the currents in the transistors 300 and 309, a first current mirror is formed with the loading resistor 305 and the transistor 309 in the I/V converter 11 as well as the current source 303 and the transistor 302 in the common mode voltage following circuit. As the current in the first current mirror corresponds to the current in the second current mirror, an average voltage at node A is proportional to a voltage at node B. In this embodiment, a ratio of a resistance value of the resistor 304 to a resistance value of the resistor 305 is set for requirement in order to control a ratio of the voltage at node A to the voltage at node B. Other similar descriptions are omitted here.

Figure 4:
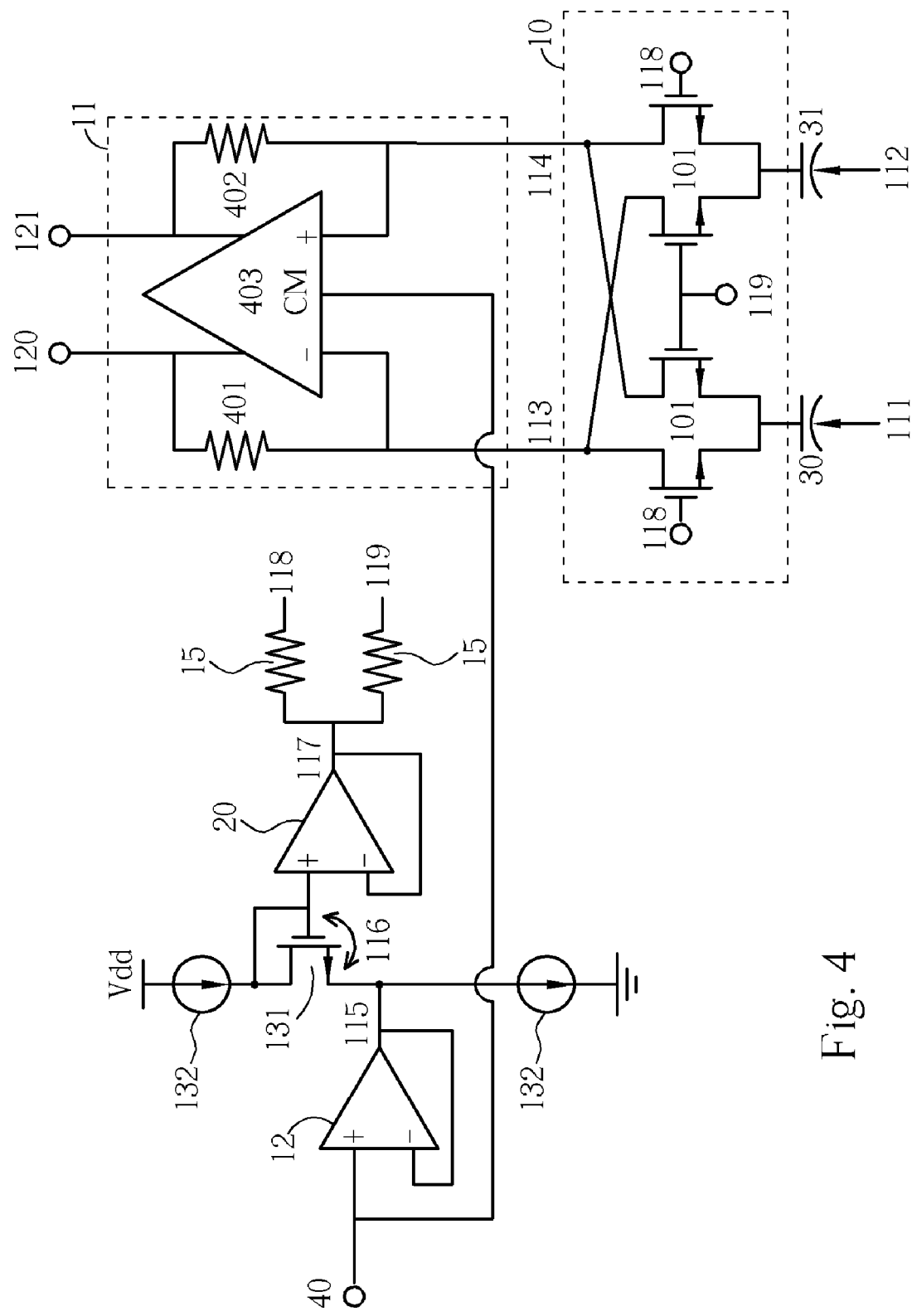
FIG. 4 is a diagram of a mixer according to a third embodiment of the present invention.

Please refer to FIG. 4. FIG. 4 is a diagram of a mixer according to a third embodiment of the present invention. The I/V converter 11 of this embodiment includes two loading resistors, 401 and 402, and an operational amplifier 403, which is a differential operational amplifier. The operational amplifier 403 includes a common mode voltage input terminal CM for controlling the common mode voltage of the output signals of the I/V converter 11. In this embodiment, the common mode voltage can be controlled by an external signal, such as the reference voltage 40 inputted into the common mode voltage input terminal CM. Other similar descriptions are omitted here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mixer comprising:
   a mixing module for mixing a first set of differential signals and a second set of differential signals to generate a mixed signal, wherein the mixing module controls a common mode voltage of the mixed signal according to a first reference voltage;
   a compensation module coupled to the mixing module for compensating at least one operation point of the mixing module according to the first reference voltage; and
   a plurality of switching transistors for synthesizing the first set of differential signals and the second set of differential signals to generate a set of differential current signals;
   wherein the common mode voltage is equal to the first reference voltage, a voltage synthesizing circuit performs a superposing operation on the first reference voltage and a biasing voltage to generate a synthesized voltage, and biasing units convert the synthesized voltage into gate biasing voltages of the switching transistors.

2. The mixer of claim 1, wherein the mixing module further comprises:
   a current-to-voltage converter coupled to the switching transistors for generating the mixed signal according to the set of differential current signals, the current-to-voltage converter including a common mode voltage input terminal for inputting the first reference voltage.

3. The mixer of claim 2, wherein the compensation module further comprises:
   wherein the biasing circuit is for generating a biasing voltage;
   wherein the voltage synthesizing circuit is coupled to the biasing circuit for generating the synthesized voltage according to the first reference voltage and the biasing voltage;
   and the plurality of biasing units are respectively coupled to the switching transistors and the voltage synthesizing circuit for compensating operation points of the switching transistors according to the synthesized voltage.

4. The mixer of claim 3, wherein the biasing circuit further comprises:
   a reference transistor; and a reference current source coupled to the reference transistor for driving the reference transistor to generate the biasing voltage.

5. The mixer of claim 4, wherein the reference transistor and the switching transistors correspond to the same characteristics.

6. The mixer of claim 2, wherein the current-to-voltage converter further comprises:
   an operational amplifier including the common mode voltage input terminal; and
   at least one loading resistor.

7. A compensation method comprising:
   generating a mixed signal by controlling a common mode voltage of the mixed signal according to a first reference voltage;
   compensating at least one operation point of a mixing module according to the first reference voltage;
   synthesizing a first set of differential signals and a second set of differential signals to generate a set of differential current signals; generating a biasing voltage;
   generating a synthesized voltage according to the first reference voltage and the biasing voltage; and
   compensating operation points of switching transistors according to the synthesized voltage;
   performing a superposing operation on the first reference voltage and the biasing voltage to generate the synthesized voltage; and
   converting the synthesized voltage into gate biasing voltages of the plurality of switching transistors.

8. The method of claim 7 further comprising:
   generating the mixed signal according to the set of differential current signals.

9. The method of claim 7, wherein the common mode voltage is equal to the first reference voltage.

10. A mixer comprising:
    a mixing module for mixing a first set of differential signals and a second set of differential signals to generate a mixed signal, wherein the mixing module controls a common mode voltage of the mixed signal according to a first reference voltage;
    a compensation module coupled to the mixing module for compensating at least
    one operation point of the mixing module according to the first reference voltage; and
    a current-to-voltage converter coupled to switching transistors for generating the mixed signal according to the set of differential current signals, the current-to-voltage converter including a common mode voltage input terminal for inputting the first reference voltage;
    wherein the common mode voltage is equal to the first reference voltage, a voltage synthesizing circuit performs a superposing operation on the first reference voltage and a biasing voltage to generate a synthesized voltage, and biasing units convert the synthesized voltage into gate biasing voltages of the switching transistors.

11. The mixer of claim 10, wherein the compensation module further comprises:
    wherein the biasing circuit is for generating a biasing voltage;
    wherein the voltage synthesizing circuit is coupled to the biasing circuit for generating the synthesized voltage according to the first reference voltage and the biasing voltage; and
    the plurality of biasing units are respectively coupled to the switching transistors and the voltage synthesizing circuit for compensating operation points of the switching transistors according to the synthesized voltage.

12. The mixer of claim 10, further comprising:
    a plurality of switching transistors for synthesizing the first set of differential signals and the second set of differential signals to generate a set of differential current signals.

* * * * *